United States Patent
Dobashi

(10) Patent No.: US 10,270,946 B2
(45) Date of Patent: Apr. 23, 2019

(54) SOLID STATE IMAGING DEVICE, CAMERA MODULE AND ELECTRONIC DEVICE

(71) Applicant: SONY CORPORATION, Tokyo (JP)

(72) Inventor: Eiichiro Dobashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/775,934

(22) PCT Filed: Mar. 12, 2014

(86) PCT No.: PCT/JP2014/056523
§ 371 (c)(1),
(2) Date: Sep. 14, 2015

(87) PCT Pub. No.: WO2014/156658
PCT Pub. Date: Oct. 2, 2014

(65) Prior Publication Data
US 2016/0028928 A1    Jan. 28, 2016

(30) Foreign Application Priority Data

Mar. 25, 2013 (JP) ................. 2013-062021

(51) Int. Cl.
*H04N 5/225*     (2006.01)
*H01L 27/146*    (2006.01)

(52) U.S. Cl.
CPC ..... *H04N 5/2253* (2013.01); *H01L 27/14618* (2013.01); *H04N 5/2252* (2013.01); *H04N 5/2254* (2013.01); *H04N 5/2257* (2013.01); *H01L 2224/48091* (2013.01)

(58) Field of Classification Search
None
See application file for complete search history.

(56) References Cited

FOREIGN PATENT DOCUMENTS

| JP | 2005-328364 A | 11/2005 |
| JP | 2007-221332 A | 8/2007 |
| JP | 2007-300488 A | 11/2007 |
| JP | 2008-235869 A | 10/2008 |
| JP | 2011-86670 A | 4/2011 |
| JP | 2011-101385 A | 5/2011 |
| JP | 2011-147091 A | 7/2011 |

OTHER PUBLICATIONS

International Search Report prepared by the Japanese Patent Office dated Jun. 2, 2014, for International Application No. PCT/JP2014/056523.

*Primary Examiner* — Stephen P Coleman
(74) *Attorney, Agent, or Firm* — Sheridan Ross P.C.

(57) ABSTRACT

There is provided a solid state imaging device. A rib is arranged on a frame part to be joined to a board on which an image sensor is mounted, the rib abutting on the board at an abutting position next to a periphery of the image sensor.

15 Claims, 7 Drawing Sheets

SOLID STATE IMAGING DEVICE, CAMERA MODULE AND ELECTRONIC DEVICE

CROSS REFERENCE TO RELATED APPLICATIONS

This application is a national stage application under 35 U.S.C. 371 and claims the benefit of PCT Application No. PCT/JP2014/056523 having an international filing date of Mar. 12, 2014, which designated the United States, which PCT application claimed the benefit of Japanese Patent Application No. 2013-062021 filed Mar. 25, 2013, the disclosures of which are incorporated herein by reference in their entirety.

TECHNICAL FIELD

The present technique relates to a solid state imaging device, a camera module and an electronic device, particularly to a solid state imaging device, a camera module and an electronic device each having a thinner board with improved stiffness to allow height reduction of a housing thereof.

BACKGROUND ART

The recent trend has been toward a smaller and thinner camera module, and, in order to make a camera module thinner, a thinner board has been pursued. As of late, the thickness of a mainstream board is approximately 0.3 mm in consideration of strength or warping of the body.

For example, a technique has been proposed to provide a camera module provided with a frame, which includes a circuit board and a cover member that is fixed onto the circuit board to cover an image sensor provided thereon (see Patent Literature 1).

CITATION LIST

Patent Literature

Patent Literature 1: JP 2004-304605A

SUMMARY OF INVENTION

Technical Problem

However, in the technique in Patent Literature 1, the frame is joined to the board only at its outermost periphery. Accordingly, when made thinner, for example, to 0.3 mm, which is the thickness of mainstream boards, or less, the board becomes flexed in an area such as a central area upon drop impact or while an anisotropic conductive film (ACF) is being pressure-bonded thereto. This leads to flexure of the image sensor provided on the board. As a result, the image sensor sometimes cracks or warps, which causes short circuit of connection parts electrically connecting between the board and the image sensor or causes short circuit between the board and the passive components. These risks have posed obstacles to making the board thinner (to making the module thinner).

The present technique has been made in view of the above circumstances, and especially improves stiffness of a board by reinforcing the board by bonding, to the board, a frame part including a rib provided so as to abut on the board at a position next to the periphery of an image sensor. Thereby, the present technique enables, for example, a camera module using a thinner board to be reduced in height but to have a sufficient stiffness, and accordingly makes it possible to prevent deterioration in optical performance due to cracking, warping, shift (displacement) or flexure of an image sensor, and thus to prevent occurrence of associated short circuit.

Solution to Problem

A solid state imaging device according to a first aspect of the present technique arranges a rib on a frame part to be joined to a board on which an image sensor is mounted, the rib abutting on the board at an abutting position next to a periphery of the image sensor.

The rib can be provided in the frame part inwardly from a periphery of the frame part.

The frame part can further include, in the periphery of the frame part, a support that abuts on the board at an abutting position. At least either of the abutting positions at which the support and the rib are to abut can be bonded to the board with adhesive.

The rib can be integrated with the support.

The rib integrated with the support can be arranged on the frame part so as to abut at the abutting position which is next to the periphery of the image sensor and which is between the passive components.

The rib can be arranged on the frame part to be joined onto the board on which the image sensor and passive components are mounted so as to abut at the abutting position which is next to the periphery of the image sensor and which is between the passive components or between the image sensor and the passive components.

The board can have a thickness of less than 0.3 mm.

The board can have a passive component incorporated therein.

The board can be formed of flame retardant type (FR) 4, FR5 or ceramic.

The frame part may be formed of epoxy resin, nylon resin, polycarbonate resin or liquid crystal polymer (LCP) resin.

A camera module according to the present technique can include: the solid state imaging device according to claim 1; and a light-receiving lens unit arranged on the part.

An electronic device according to a second aspect of the present technique arranges a rib on a frame part to be joined to a board on which an image sensor is mounted, the rib abutting on the board at an abutting position next to a periphery of the image sensor.

In first and second aspects of the present technique, a rib is arranged on a frame part, which is to be joined onto a board on which an image sensor is mounted, so that the rib can abut on the board at an abutting position next to a periphery of the image sensor.

Advantageous Effects of Invention

The first and second aspects of the present technique enable a camera module to be reduced in height by using a thinner board therein but to have a sufficient stiffness, and accordingly makes it possible to prevent cracking or warping of an image sensor, and thus to prevent occurrence of associated short circuit.

DESCRIPTION OF EMBODIMENTS

<Camera Module to which the Present Technique is Applied>

Figure 1:
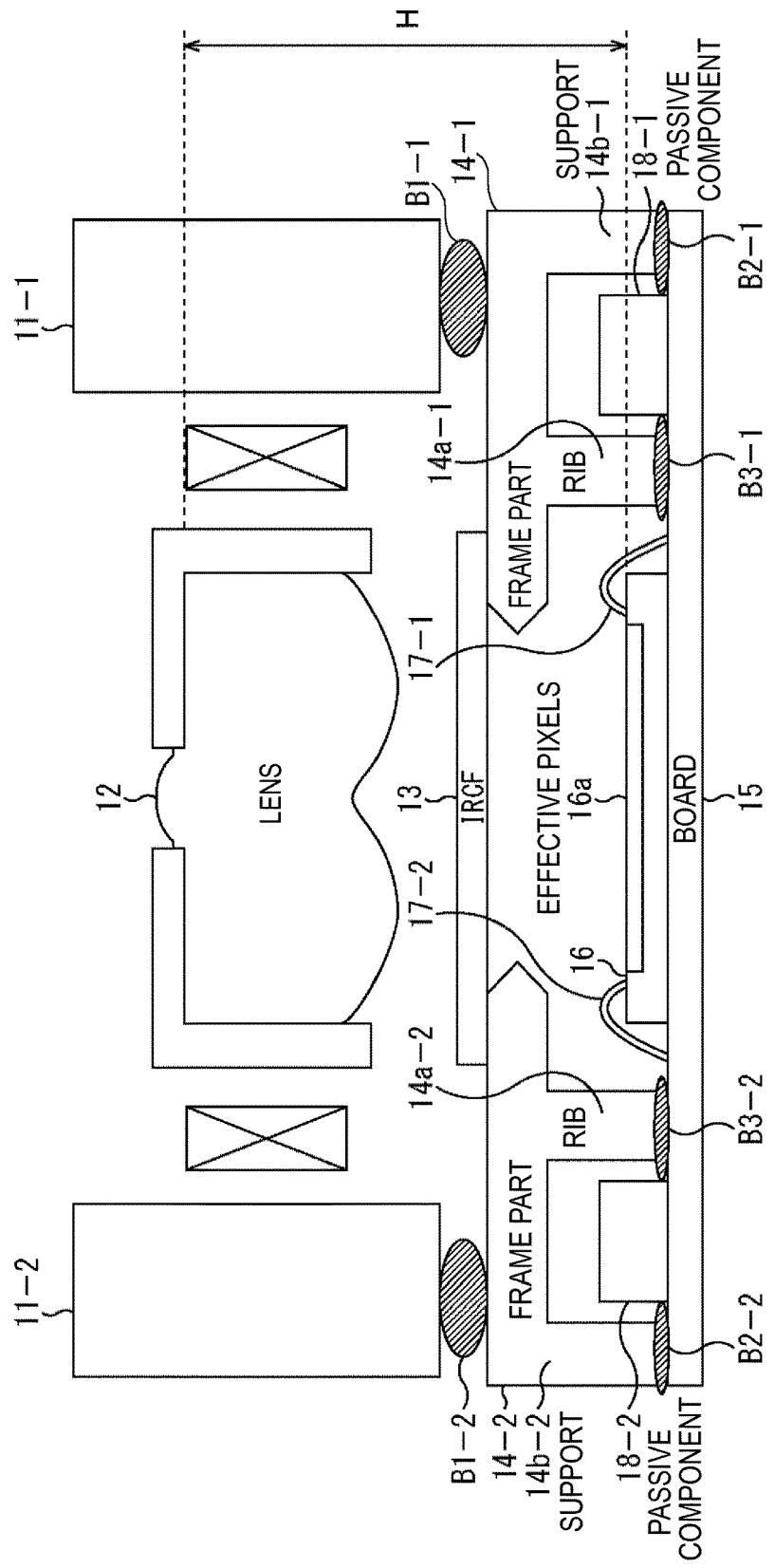
FIG. 1 is a sectional side view showing an exemplary configuration of an embodiment of a camera module in which a solid state image sensor of the present technique is employed.

FIG. 1 is a sectional side view showing an exemplary configuration of an embodiment of a camera module in which a solid state image sensor of the present technique is employed. The camera module includes a lens unit 11-1 and 11-2 which includes a lens 12, an infrared cut-off filter (IRCF) 13, a board 15, an image sensor 16, wiring 17 and passive components 18-1 and 18-2. Note that the lens unit 11-1 and 11-2 is shown as if being separated on the right and left sides in FIG. 1, but is integrated as a single component. Similarly, a frame part 14-1 and 14-2 is shown as if being separated on the right and left sides in FIG. 1, but is integrated as a single component, too. In contrast, the passive components 18-1 and 18-2 are separate but identical. Accordingly, in the following description, when it is not necessary to particularly distinguish between 11-1 and 11-2 of the lens unit, between 14-1 and 14-2 of the frame part, and between the passive components 18-1 and 18-2, they will be simply referred to as a lens unit 11, a frame part 14 and passive components 18, and the other components will be similarly referred to.

The camera module shown in FIG. 1 is provided in a mobile phone and the like, for example. Light incident from above the lens 12 of the lens unit 11 in FIG. 1 passes through the IRCF 13 to form an image on the image sensor 16, and the image sensor 16 generates image data based on the formed image, and outputs the image data.

The lens unit 11 is cylindrical, and stores therein the lens 12, which is cylindrical or prism-shaped. By moving the lens 12 in the up-down direction in FIG. 1, the lens unit 11 adjusts a focal position, a zoom factor and the like of an image to be formed. The IRCF 13 blocks infrared rays of light incident thereon through the lens 12 to let the filtered light pass onto the image sensor 16. Note that FIG. 1 shows an example of the lens unit 11 in which the lens 12 is configured to move in the up-down direction in FIG. 1, but the lens 12 may be fixed not to move in the lens unit 11.

The image sensor 16 is provided on the board 15 having wiring and the like printed thereon, and electrically connected to the wiring printed on the board 15 through the wiring 17-1 and 17-2 in an area other than effective pixels 16a on the image sensor 16. Among pixels provided on the image sensor 16, the effective pixels 16a are effective pixels used to generate image data as an imaged image. In addition to the effective pixels 16a, the image sensor 16 is also provided with unillustrated components such, for example, as optical black (OPB) pixels and connecting terminals for inputting/outputting signals and for receiving power supply.

The passive components 18-1 and 18-2, each of which is formed of electrical circuit components and the like such, for example, as a capacitor, a resistor and an integrated circuit (IC), are disposed at predetermined positions on the board 15 and electrically connected thereto. Note that FIG. 1 shows a case where the passive components 18-1 and 18-2 and the like are on the board 15, but the passive components 18-1 and 18-2 and the like do not have to be on the board.

The frame part 14-1 and 14-2 is formed of epoxy resin, nylon resin, liquid crystal polymer (LCP) resin, polycarbonate resin or the like. As shown in FIG. 1, the frame part 14-1 and 14-2 has an opening over the image sensor 16 on the board 15, which is formed of flame retardant type (FR) 4, FR5, ceramic or the like, while covering an area other than the image sensor 16 on the board 15. The frame part 14-1 and 14-2 has a support 14b-1 and 14b-2 provided at an outermost peripheral position of the frame part 14-1 and 14-2 so as to face and abut on the board 15. In addition, the frame part 14-1 and 14-2 also has ribs 14a-1 and 14a-2 provided so as to face and abut on the board 15. Specifically, the ribs 14a-1 and 14a-2 are provided so as to abut on the board 15 at positions other than the positions where the image sensor 16 and the passive components 18-1 and 18-2 arranged on the board 15 are disposed. Adhesive B2-1, B2-2, B3-1 and B3-2 is applied to the ribs 14a-1 and 14a-2 and the support 14b-1 and 14b-2, respectively, at positions where the ribs 14a-1 and 14a-2 and the support 14b-1 and 14b-2 abut on the board 15, and the board 15 is joined to the frame part 14-1 and 14-2. The IRCF 13 is provided above the board 15 at a position facing the opening of the frame part 14. In addition, the lens unit 11 is mounted on the frame part 14 as shown in FIG. 1. Specifically, with adhesive B1-1 and B1-2 applied to the periphery of the frame part 14-1 and 14-2, the lens unit 11 is mounted to be bonded onto the frame part 14-1 and 14-2. The components assembled as above constitute the camera module as a whole.

Figure 2:
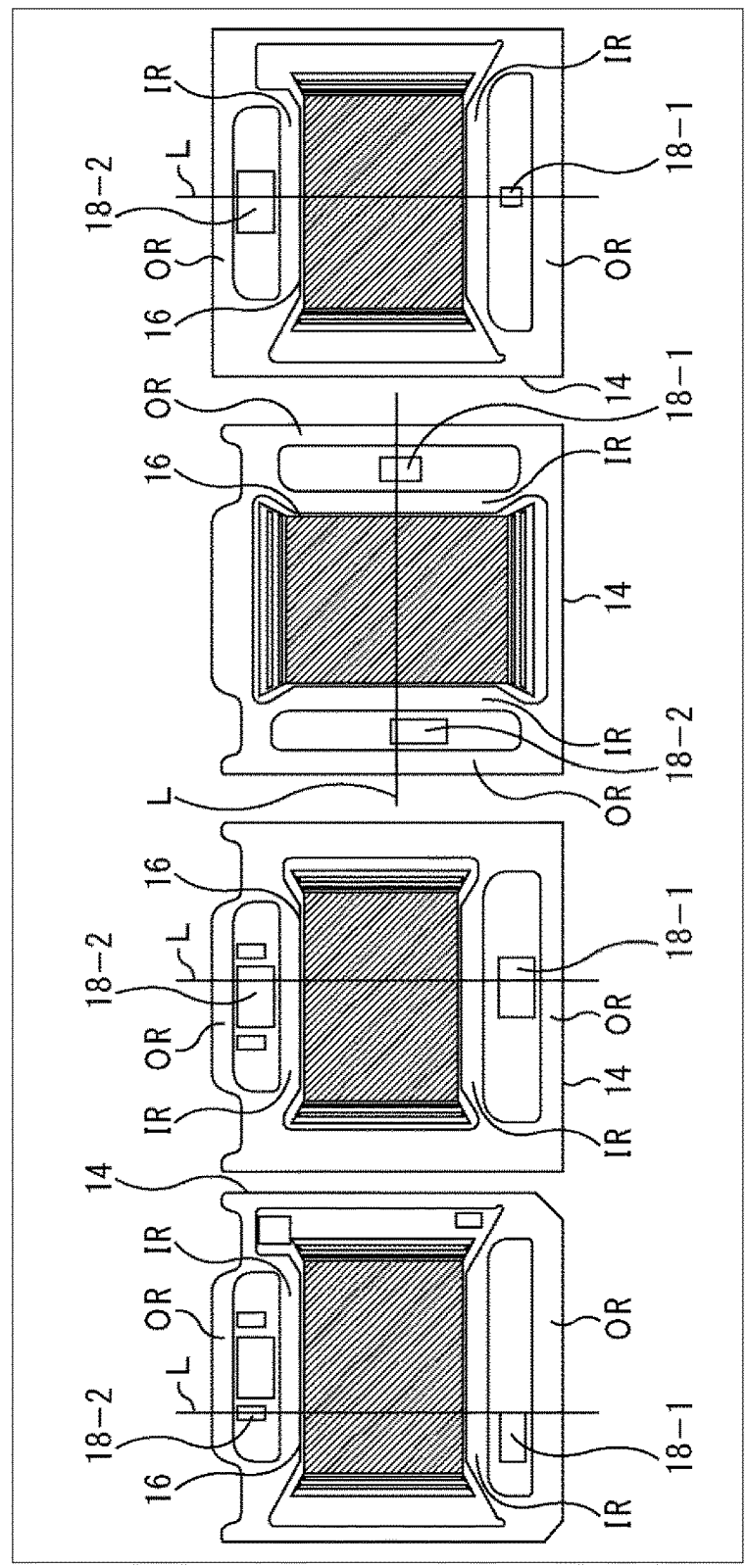
FIG. 2 shows disposition examples of a support and ribs provided to a frame.

As shown in FIG. 2, the ribs 14a of the frame part 14 abut on the board 15 at abutting positions IR, and the support 14b of the frame part 14 abuts on the board 15 at an abutting position OR, for example. Specifically, FIG. 2 shows four disposition examples on the board 15 as bottom views of the frame part 14 seen through the board 15, and each of the sectional views taken along the lines L of the disposition examples corresponds to FIG. 1. FIG. 2 shows the frame part 14 as viewed from the bottom surface thereof through the unillustrated board 15, and the rectangular shaded area represents the image sensor 16. As shown in FIG. 2, in any case, the ribs 14a are placed so as to abut on the board 15 at the abutting positions IR arranged next to the image sensor 16. Similarly, as shown in FIG. 2, in any case, the support 14b is placed so as to abut on the board 15 at the abutting position OR arranged on the periphery of the board 15. Since the abutting position OR is provided along the periphery of the board 15, the abutting positions IR are actually provided on the board 15 inwardly from the abutting position OR. Similarly, since the support 14b is placed along the periphery of the frame part 14, the ribs 14a are placed inwardly from the support 14b. As used herein, the abutting positions IR and OR are positions on the board 15, which is not shown in FIG. 2. Accordingly, FIG. 2 shows the state where the ribs 14a and the support 14b of the frame part 14 abut on the unillustrated board 15 at the abutting positions IR and OR thereon.

When the frame part 14 provided with the ribs 14a configured as above is bonded to the board 15, the stiffness of the frame part 14 adds to the strength of the board 15 enough to prevent bending or flexure thereof. Specifically, the stiffness of the frame part 14 adds to the strength of the board 15 enough to prevent bending or flexure thereof in a way that, in abutting contact at the abutting position IR provided next to the image sensor 16, that is, provided in vicinity to the area where the image sensor 16 is provided, the ribs 14a are bonded onto the board 15 with the adhesive B3. This means that the strength of the board 15 is improved enough to prevent bending or flexure thereof especially in the area where the image sensor 16 is provided. Accordingly, the image sensor 16 can be prevented from being flexed, bent or displaced, and thus short circuit of the electrically-connected parts due to flexure, bending or displacement of the image sensor 16 can also be prevented. This consequently makes it possible to make the board 15 even thinner than 0.3 mm, a thickness of mainstream boards now available, and accordingly makes it possible to reduce the height of a solid state imaging device. Accordingly, by mounting the lens unit on this solid state imaging device having a reduced height, the camera module can be reduced in height as a whole.

The camera module in FIG. 1 can be regarded to include the lens unit 11 and a solid state imaging device package enclosed by the IRCF 13, the frame part 14 and the board 15. In other words, depending on the combinations of a lens unit and a solid state imaging device package, the camera module can have various optical properties corresponding to types of the lens 12 included in the lens unit 11.

[Variations of the Rib and the Support]

Figure 3:
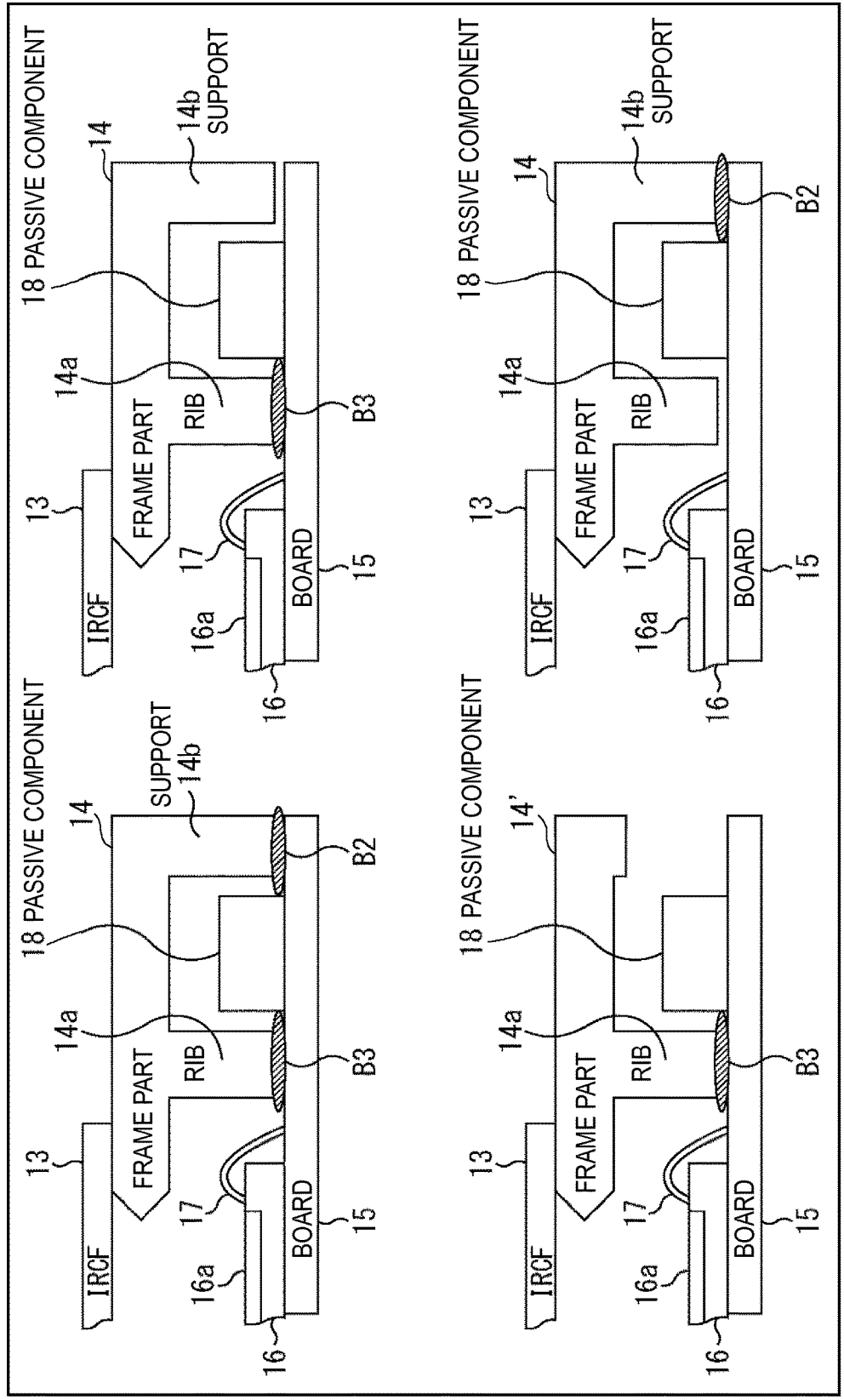
FIG. 3 shows variations both of configurations of ribs and a support and of the presence and absence of adhesive used to bonding the ribs and the support onto a board.

As described above, the ribs 14a, which are arranged on the frame part 14 so as to abut next to the image sensor 16 on the board 15, are bonded with the adhesive B3 onto the board 15 at the abutting positions IR, which are arranged at positions facing the ribs 14a, as shown in the upper left part of FIG. 3. This adds to the strength of the region, where the image sensor 16 is provided, of the board 15, and suppresses flexure of the board 15, accordingly. As a result, problems such as bending of the image sensor 16 and short circuit between the image sensor 16 and the passive components 18 are also prevented.

Accordingly, similar effects can be provided as long as the ribs 14a of the frame part 14 are provided so as to abut next to the image sensor 16 on the board 15. Thus, the following variations of the ribs 14a and the support 14b are also conceivable.

For example, the support 14b of the frame part 14 does not have to be joined onto the board 15 at the abutting position OR with adhesive applied thereto in order to provide the similar effects. These effects can be provided as long as the adhesive B3 is applied onto the abutting positions IR at which the ribs 14a abut on the board 15, as shown in the upper right part of FIG. 3.

Alternatively, as shown in the lower left part of FIG. 3, a frame part 14' in which the support 14b is omitted may be employed in place of the frame part 14, and only the ribs 14a may be bonded with the adhesive B3 onto the board 15 in abutting contact at the abutting positions IR. Even in this configuration, the ribs 14a of the frame part 14' are fixed to the board 15 at the abutting positions IR with the adhesive B3 applied thereto, abutting next to the periphery of the image sensor 16. Accordingly, even this configuration can prevent flexure or bending of the board 15 in the area where the image sensor 16 is provided, and consequently prevent bending of the image sensor 16 or occurrence of short circuit.

As shown in the lower right part of FIG. 3, a still alternative configuration may be employed in which only the support 14b of the frame part 14 is bonded onto the board 15 at the abutting position OR with the adhesive B2 applied thereto, and in which no adhesive is applied between the ribs 14 and the abutting positions IR of the board 15. Even in this configuration, the support 14b of the frame part 14 is fixed to the board 15 at the abutting position OR with the adhesive B2 applied thereto, and the ribs 14a abut at the abutting positions IR next to the periphery of the image sensor 16. Accordingly, even this configuration can prevent flexure or bending of the board 15 in the area where the image sensor 16 is provided, and consequently prevent bending of the image sensor 16 or occurrence of short circuit.

Note that, to clarify the presence or absence of adhesive, the state where the adhesive B2 or B3 is not applied to the abutting position IR or OR at which the rib 14a or the support 14b abuts on the board 15 is illustrated as if the rib 14a or the support 14b does not abut on the board 15 in FIG. 3. However, the ribs 14a and the support 14b actually completely abut on the board 15 at the abutting positions IR and OR regardless of the presence or absence of the adhesive B2 or B3.

Figure 4:
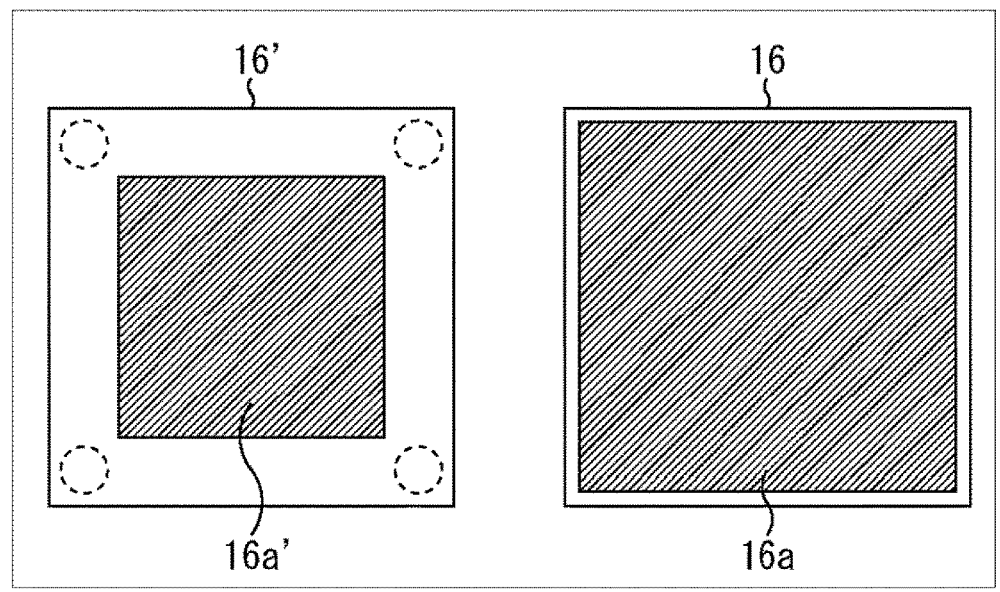
FIG. 4 is a diagram for illustrating a disposition area of effective pixels in an image sensor of related art.

In the past, as shown in the left part of FIG. 4, the effective pixels 16a' occupied a part of the entire surface of the image sensor 16, and thus, in some configurations, the support of the frame part abutted thereon at positions other than a region where the effective pixels 16' were disposed, such, for example, as the positions indicated by the dotted-line circles. In this configuration, the image sensor 16 is sandwiched and fixed between the board 15 and the frame part 14, so that the frame part 14 can add to the strength of the board 15 in the entire area enough to prevent flexure thereof, and thus add to the strength of the image sensor 16 in the entire area enough to prevent bending thereof. Meanwhile, a height H from the lens 12 to the image sensor 16 shown in FIG. 1 has to be a predetermined height, large enough to meet optical requirements. Accordingly, to reduce a total thickness (height) to the board 15 including the lens unit 11, that is, to achieve height reduction, the board 15 has been reduced in thickness (made thinner). However, as the board 15 has been made thinner, the strength of the board 15 to prevent bending or flexure thereof has been kept reduced.

In addition, in the image sensor 16 in recent years, a region where the effective pixels 16a' are disposed has been increased to cover substantially the entire surface of the image sensor 16, as shown in the right part of FIG. 4. Accordingly, it becomes more difficult to provide an abutting position on the image sensor 16 at which the support is to abut thereon, unlike in the past. However, omitting the support from the frame part 14 in order to meet the difficulty might cause cracking and/or warping of the image sensor 16, and/or short circuit of the passive components since the strength of the board 15 around the image sensor 16 has been reduced as the board 15 has been made thinner.

In contrast, as has been described with reference to FIGS. 1 to 3, when the ribs 14a are provided to the frame part 14 so as to abut on the board 15 at the abutting positions IR, which are next to the periphery of the image sensor 16, the board 15 provided with the image sensor 16 can be fixed to the frame part 14 at positions next to the periphery of the image sensor 16. Accordingly, though the image sensor 16 is not directly fixed to the support, the above configuration can achieve conditions close to those achieved when the support abuts directly on the image sensor 16. Thus, even when the board 15 made thinner to have reduced strength is used, flexure and/or bending of the board 15 can be suppressed because the ribs 14a of the frame part 14 add to the strength of the board 15. This consequently prevents bending, displacement or flexure of the image sensor 16 provided on the board 15, thus preventing associated short circuit in the electrical connection between the image sensor 16 and electrodes provided to the board 15, and preventing deterioration in optical performance.

In the description of the examples shown in FIG. 2, the abutting positions IR and OR at which the ribs 14a and the support 14b of the frame part 14 abut on the board 15, which is not shown in FIG. 2, are integrated in vicinity to the corners of the frame part 14. However, the abutting positions IR at which the ribs 14a abut and the abutting position OR at which the support 14b abuts may be completely separated from one another as shown in the left part of FIG. 5, for example. In other words, in each example in FIG. 2, the ribs 14a and the support 14b are integrated in vicinity to the corners of the frame part 14. However, in the frame part 14 in FIG. 5, the ribs 14a are completely separated from the support 14b.

Figure 5:
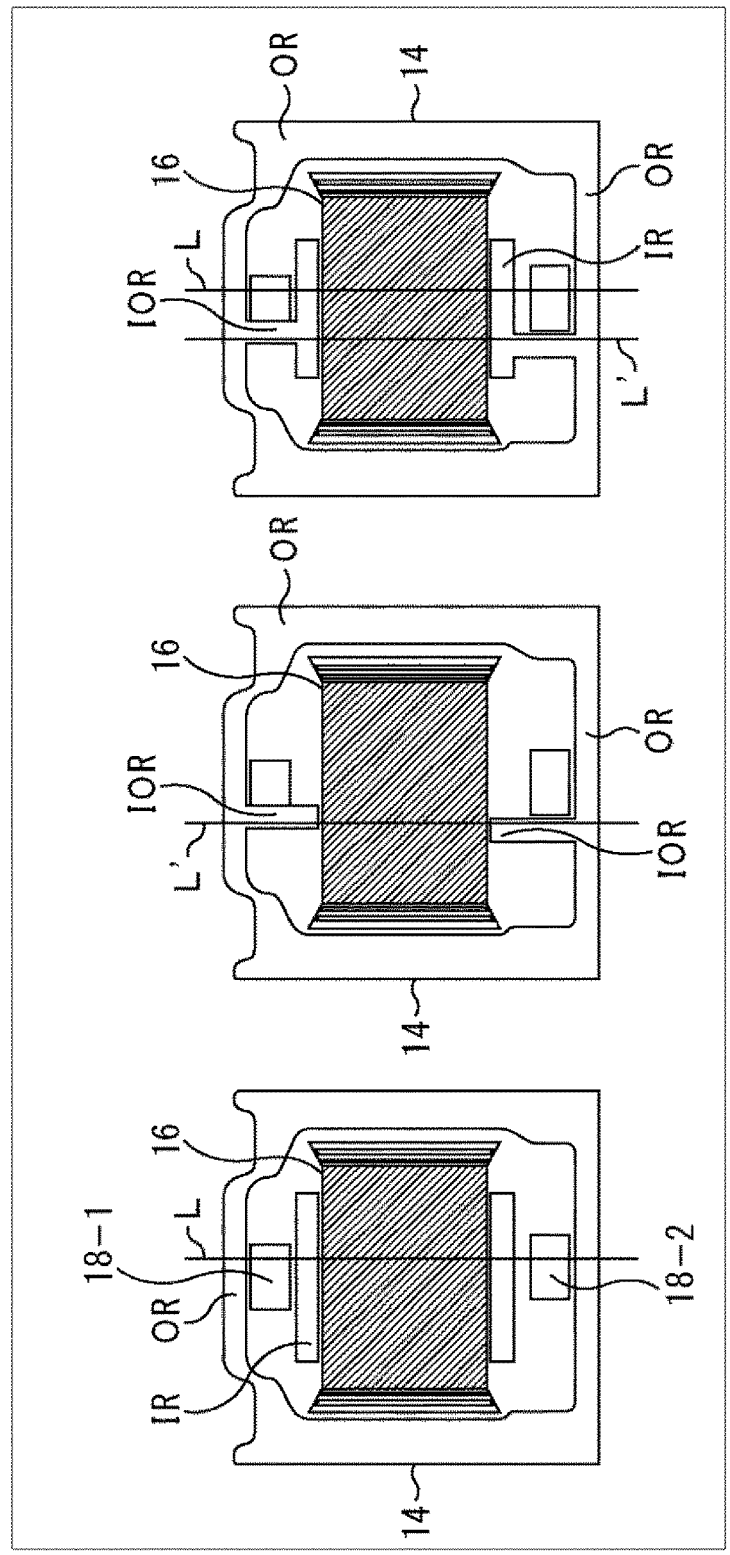
FIG. 5 shows disposition examples of a support and ribs provided to a frame.
Figure 6:
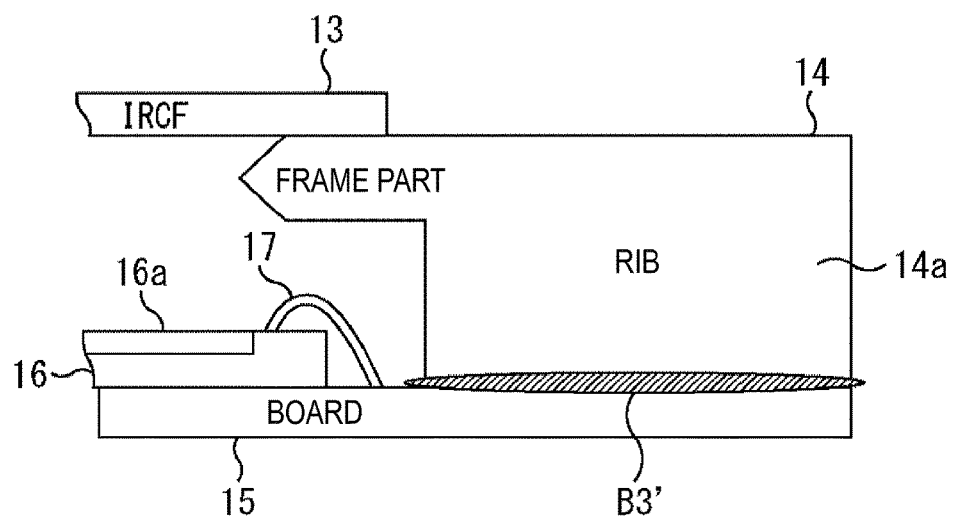
FIG. 6 illustrates an exemplary configuration of a rib integrated with a support.

Alternatively, as shown in the middle and right parts of FIG. 5, the abutting positions for the ribs 14a and the support 14b may be integrated as abutting positions IOR in vicinity to the center between sides of the frame part 14. In this case, each of the sectional side view taken along the lines L' of FIG. 5 corresponds to FIG. 6. Each rib 14a is integrated with the support 14b, and the entire surface of the rib 14a integrated with the support 14b is bonded to the board 15 with adhesive B3', which is applied onto the entire area of the abutting position IOR at which the integrated rib 14a abuts on the board 15. Note that, in each example in FIG. 5, when the ribs 14a and the support 14b abut on the board 15, the ribs 14a and the support 14b may be bonded at the abutting positions IR, OR and IOR with adhesive applied thereto, or alternatively, may be bonded either at only the abutting positions IR and IOR or at only the abutting positions OR and IOR, with adhesive applied thereto. Each of the middle and right parts of FIG. 5 shows an example in which the passive components 18 and the image sensor 16 are provided in a common region. In the example, the ribs 14a integrated with the support 14b as shown in FIG. 6 are provided so as to extend substantially across the common area where the passive components 18 and the image sensor 16 are provided, and the abutting positions IOR are provided on the board 15 so as to face the ribs 14a.

Figure 7:
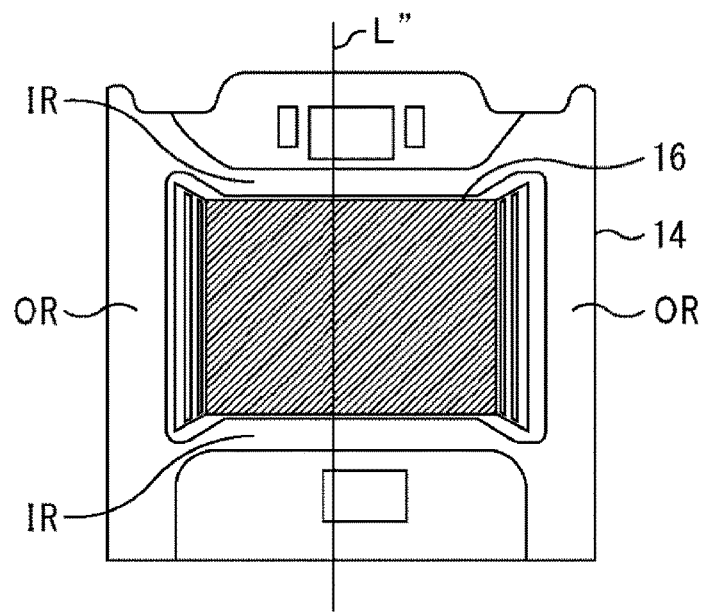
FIG. 7 illustrates an exemplary configuration in which a part of a periphery is provided with only a rib but no support.

Hereinabove, description has been given of the examples as shown in FIGS. 2 and 5 in each of which, in principle, the abutting positions IR and OR (and IOR) for the ribs 14a and the support 14b are provided on the board 15. However, there may be provided only the abutting positions IR at which the ribs 14a abut as shown in FIG. 7, for example. In this case, however, the frame part 14 has to be configured so that the sectional side view taken along the line L", for example, can correspond to the lower left part of FIG. 3.

Hereinabove, description has been given of the examples in each of which the passive components 18 are mounted on the board 15, but a board having passive components incorporated therein may be used in place of the board 15.

Figure 8:
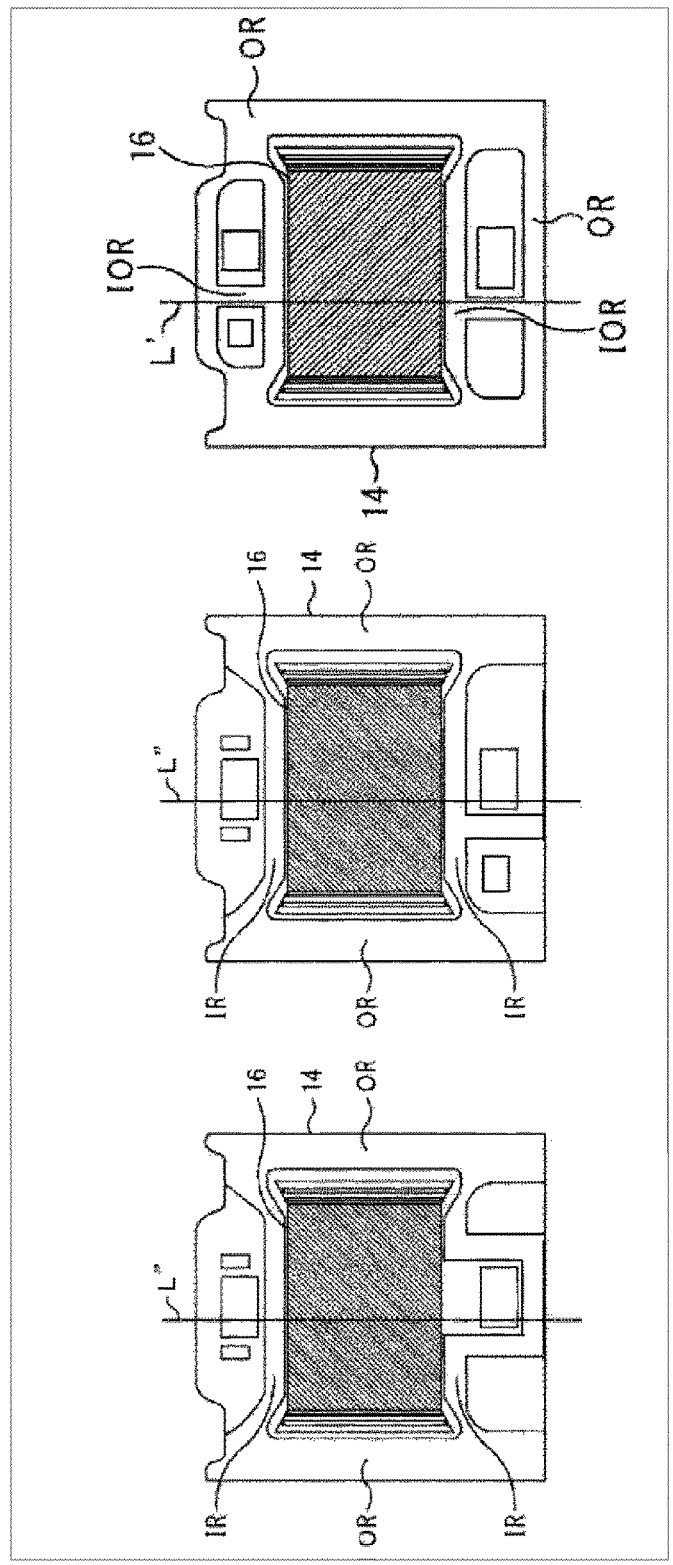
FIG. 8 illustrates another exemplary configuration of a support and ribs.

Alternatively, as shown in the left part of FIG. 8, another configuration may be employed, which includes the abutting positions IR and OR having shapes fitting each other like a lock and a key, and which includes the rib 14a and the support 14b having shapes corresponding to these shapes. Alternatively, as shown in the middle part of FIG. 8, another configuration may be employed, which includes the abutting position IR having a shape extending to the periphery of the board 15, and which includes the rib 14a having a shape corresponding to the shape. Still alternatively, as shown in the right part of FIG. 8, another configuration may be employed, which includes the abutting position IOR arranged between the passive components, and which includes the rib 14a having a shape corresponding to that of the abutting position IOR. The example shown in the left part of FIG. 8 has a cross section along the line L" which, in the upper part of FIG. 8, is similar to that shown in the lower left part of FIG. 3, but which, in the lower part of FIG. 8, includes only the support 14b but not the rib 14a. The example shown in the middle part of FIG. 8 has a cross section along the line L" which is similar to that shown in the lower left part of FIG. 3 both in the upper and lower parts of FIG. 8. The example shown in the right part of FIG. 8 has a cross section along the line L" which is similar to that shown in FIG. 6 both in the upper and lower parts.

Though the description has been given assuming that each rib abuts on the board, the rib may have such a height as to function as a rib only when adhesive is applied thereto so that the rib may be allowed to function as a rib or not depending on the presence or absence of adhesive. This makes it possible to adjust the reinforcement level by the frame part 14 and man-hours requisite for bonding. Specifically, to increase the reinforcing effect of the frame part 14, the frame part 14 may be bonded to the board after adhesive is applied to all the portions functionable as ribs. When slightly lowering the reinforcement level by the frame part 14 have substantially no influence, the frame part 14 may be bonded to the board after adhesive is applied to requisite minimum numbers of the portions functionable as ribs.

As described above, in each example, the present technique makes it possible to suppress flexure and/or bending of the board 15 around the image sensor 16 even when the board 15 is made thinner to have reduced strength, because the ribs 14a of the frame part 14, which abut on the board 15 at the abutting positions IR provided next to the periphery of the image sensor 16, add to the strength of the board 15 in the area around the image sensor 16. This, accordingly, prevents bending, displacement or flexure of the image sensor 16 provided on the board 15, thus preventing short circuit in the electrical connection between the image sensor 16 and the electrodes provided to the board 15, and preventing deterioration in optical performance. Consequently, this enables a solid state imaging device to be reduced in height but to have a sufficient stiffness around the image sensor 16, even when the board 15 of a thinner type is used. Furthermore, the achievement of height reduction of a solid state imaging device enables height reduction of a camera module including a lens unit mounted on the height-reduced solid state imaging device (or package thereof).

Note that embodiments of the present technique are not limited to the above, and various changes and modifications may be made without departing from the scope of the present technique.

Additionally, the present technology may also be configured as below.

(1)

A solid state imaging device, wherein a rib is arranged on a frame part to be joined to a board on which an image sensor is mounted, the rib abutting on the board at an abutting position next to a periphery of the image sensor.

(2)

The solid state imaging device according to (1), wherein the rib is provided in the frame part inwardly from a periphery of the frame part.

(3)

The solid state imaging device according to (2),
wherein the frame part further includes, in the periphery of the frame part, a support that abuts on the board at an abutting position, and
wherein at least either of the abutting positions at which the support and the rib are to abut is bonded to the board with adhesive.

(4)

The solid state imaging device according to (3),
wherein the rib is integrated with the support.

(5)

The solid state imaging device according to (4),
wherein the rib integrated with the support is arranged on the frame part so as to abut at the abutting position which is next to the periphery of the image sensor and which is between passive components.

(6)

The solid state imaging device according to (1),
wherein the rib is arranged on the frame part to be joined onto the board on which the image sensor and passive components are mounted so as to abut at the abutting position which is next to the periphery of the image sensor and which is between the passive components or between the image sensor and the passive components.

(7)

The solid state imaging device according to (1),
wherein the board has a thickness of less than 0.3 mm (8)

The solid state imaging device according to any of (1) to (7),
wherein the board has a passive component incorporated therein.

(9)

The solid state imaging device according to any of (1) to (8),
wherein the board is formed of flame retardant type (FR)4, FR5 or ceramic.

(10)

The solid state imaging device according to any of (1) to (9),
wherein the frame part is formed of epoxy resin, nylon resin, polycarbonate resin or liquid crystal polymer (LCP) resin.

(11)

A camera module including:
the solid state imaging device according to claim 1; and
a light-receiving lens unit arranged on the part.

(12)

An electronic device,
wherein a rib is arranged on a frame part to be joined to a board on which an image sensor and passive components are mounted, the rib abutting at an abutting position between the passive components or between the image sensor and the passive components.

REFERENCE SIGNS LIST 11, 11-1, 11-2 lens unit
12 lens
13 IRCF
14, 14-1, 14-2 frame part
15 board
16 image sensor
16a effective pixels
17, 17-1, 17-2 wiring
18, 18-1, 18-2 passive component

What is claimed is:

1. A solid state imaging device, comprising:
a frame part joined to a board having a first surface on which an image sensor is mounted, the frame part including at least a first rib abutting on the board at a first abutting position,
wherein the first abutting position is next to a periphery of the image sensor,
wherein a periphery of the frame part includes at least a first support that abuts on the board at a second abutting position,
wherein a bottommost surface of the first support is adhered to the board at a first location and a bottommost surface of the first rib is adhered to the board at a second location of the board,
wherein the first location and the second location are at different locations on a same surface of the board; and
wherein at least a portion of the first rib is between at least one first passive component mounted on the first surface of the board and the image sensor.

2. The solid state imaging device according to claim 1, wherein the first abutting position is between the at least one first passive component and at least one second passive component or between the image sensor and the at least one first and at least one second passive components.

3. The solid state imaging device according to claim 1, wherein the board has a thickness of less than 0.3 mm.

4. The solid state imaging device according to claim 1, wherein the frame part is formed of epoxy resin, nylon resin, polycarbonate resin or liquid crystal polymer (LCP) resin.

5. A camera module comprising:
the solid state imaging device according to claim 1; and
a light-receiving lens unit arranged on the frame part.

6. An electronic device, comprising:
the solid state image device according to claim 1.

7. The solid state imaging device according to claim 1, wherein the board has the at least one first passive component incorporated therein, wherein the portion of the first rib is between the at least one first passive component mounted on the first surface of the board and the image sensor in a plan view.

8. The solid state imaging device according to claim 7, wherein the board is formed of flame retardant type (FR) 4, FR5 or ceramic, and wherein the at least one first passive component is at least one of a capacitor, a resistor, and an integrated circuit.

9. The solid state imaging device according to claim 1, further comprising a second support and a second rib, the first rib being adjacent to a first side of the image sensor, the second rib being adjacent to a second side of the image sensor, the first side and the second side being opposite sides of the image sensor, wherein at least a portion of the second rib is between at least one second passive component mounted on the first surface of the board and the image sensor, wherein a bottommost surface of the second support is adhered to the board at a third location and a bottommost surface of the second rib is adhered to the board at a fourth location of the board, and wherein the first location, the second location, the third location, and the fourth location are at different locations on the same surface of the board.

10. The solid state imaging device according to claim 9, further comprising:
a first wiring and a second wiring electrically connecting the image sensor to the board at fifth and sixth locations, respectively, the first wiring being between the image sensor and the first rib, the second wiring being between the image sensor and the second rib, and wherein the first location, the second location, the third location, the fourth location, the fifth location, and the sixth location are at different locations on the same surface of the board.

11. The solid state imaging device according to claim 10, wherein the first support is arranged such that the at least one first passive component is between the first rib and the first support, and wherein the second support is arranged such that the at least one second passive component is between the second rib and the second support.

12. The solid state imaging device according to claim 1, wherein the first rib is provided in the frame part inwardly from the periphery of the frame part.

13. The solid state imaging device according to claim 12, wherein at least either of the first rib and the periphery of the frame part is adhered to the board with adhesive.

14. The solid state imaging device according to claim 13, wherein the first rib is integrated with the first support.

15. The solid state imaging device according to claim 14, wherein the first rib integrated with the first support is between the at least one first passive component and at least one second passive component.

* * * * *